United States Patent [19]
Suwa et al.

[11] Patent Number: 5,147,168
[45] Date of Patent: Sep. 15, 1992

[54] LOADING AND UNLOADING AIRLOCK APPARATUS FOR A VACUUM TREATMENT CHAMBER

[75] Inventors: Hidenori Suwa, Zushi; Shinichi Ono, Chigasaki; Hiroyuki Hirano, Hiratsuka; Humio Naruse, Yokohama, all of Japan

[73] Assignee: Nihon Shinku Gujutsu Kabushiki Kaisha, Chigasaki, Japan

[21] Appl. No.: 450,481

[22] Filed: Dec. 14, 1989

[30] Foreign Application Priority Data

Dec. 18, 1988 [JP] Japan .................. 63-318939

[51] Int. Cl.⁵ ............................................ C23C 13/08
[52] U.S. Cl. .................................... 414/217; 414/221; 414/750; 118/719; 118/500; 204/298.25; 104/168
[58] Field of Search ............. 204/298.24, 298.25, 204/298.26; 118/719, 729, 728, 50, 50.1, 500; 414/217, 221, 222, 749, 750; 104/168

[56] References Cited

U.S. PATENT DOCUMENTS

| | | | |
|---|---|---|---|
| 4,042,128 | 8/1977 | Shrader | 104/168 X |
| 4,274,936 | 6/1981 | Love | 204/298.25 X |
| 4,749,465 | 6/1988 | Flint et al. | 414/221 X |
| 4,832,981 | 5/1989 | Yamazaki | 204/298.25 X |

FOREIGN PATENT DOCUMENTS

| | | |
|---|---|---|
| 2451549 | 10/1974 | Fed. Rep. of Germany . |
| 3639991A1 | 6/1987 | Fed. Rep. of Germany . |
| 3740855A1 | 6/1988 | Fed. Rep. of Germany . |

Primary Examiner—Frank E. Werner
Attorney, Agent, or Firm—Armstrong, Nikaido, Marmelstein, Kubovcik & Murray

[57] ABSTRACT

A loading and unloading airlock apparatus for a vacuum treatment chamber which includes an airlock chamber, a transport mechanism inside the chamber to transport a substrate holder arranged to have substrates detachably mounted thereon, an exhaust port to evacuate the chamber to a vacuum, a gas inlet port to introduce a gas to bring the evacuated chamber back to atmospheric pressure, a rectifying plate provided in the chamber adjacent to and at a predetermined distance away from the substrate holder on that side of the substrate holder upon which the substrates are detachably mounted, and a gas introduction pipe having a gas ejection outlet in said chamber for introducing additional gas in a space defined by the predetermined distance to flow along the surfaces of the substrates and the substrate holder.

4 Claims, 6 Drawing Sheets

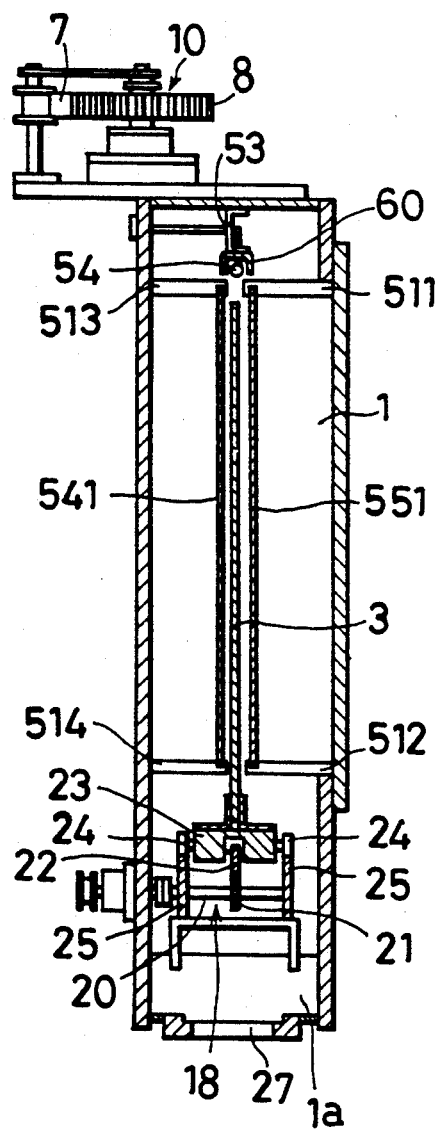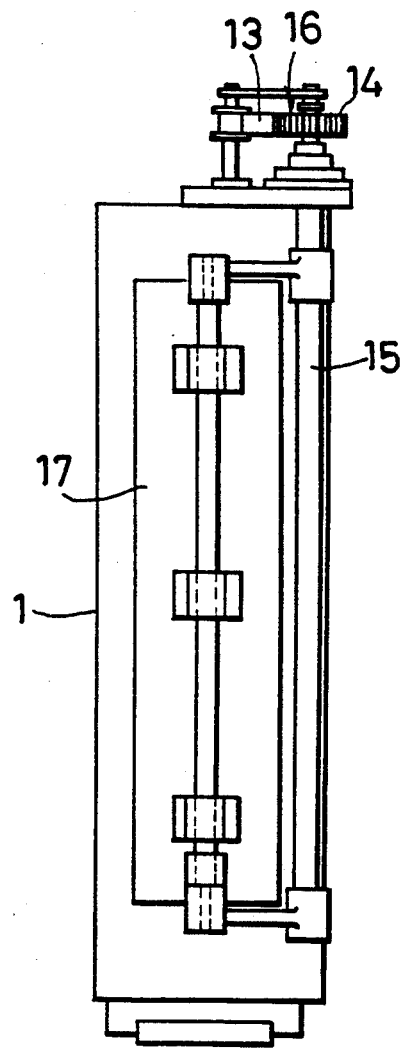

LOADING AND UNLOADING AIRLOCK APPARATUS FOR A VACUUM TREATMENT CHAMBER

BACKGROUND OF THE INVENTION

This invention relates to a loading and unloading airlock for a vacuum treatment chamber to be provided in communication with the vacuum treatment chamber in which thin films are formed on substrates or in which the thin films on the substrates are subjected to hyperfine processing.

Generally in an in-line vacuum treatment apparatus, a loading airlock for substrates is directly connected in communication with an inlet side of a vacuum treatment chamber in which thin films are formed on substrates, or in which the thin films on the substrates are subjected to hyperfine processing, and an unloading airlock is directly connected in communication with an outlet side of the vacuum treatment chamber. These loading and unloading airlocks are provided to load and unload the substrates to and from the vacuum treatment chamber without impairing the vacuum inside the vacuum treatment chamber and are arranged such that the pressure inside those chambers can be alternated between a vacuum and atmospheric pressure.

A conventional loading and unloading airlock apparatus is constructed as shown in FIGS. 10 through 13. In these figures the loading and unloading airlock apparatus is provided with a lock chamber 1. A transporting inlet 4 is provided on one side of the walls of the lock chamber 1, and a transporting outlet 5 on the opposite side. On the outer edge of the inlet 4, an inlet valve member 11 to be opened and closed by means of an opening and closing mechanism 10 comprising, for example, a rack 7 to be reciprocated by a cylinder 6, and a rotatable shaft 9 integrally formed with a gear 8 to be rotated by the rack 7, is arranged to be seated, thereby closing the transporting inlet 4. On the inner edge of the transporting outlet 5, an outlet valve member 17 to be opened and closed by means of an opening and closing mechanism 16 comprising, for example, a rack 13 to be reciprocated by a cylinder 12, and a rotatable shaft 15 integrally formed with a gear 14 to be rotated by the rack 13, is arranged to be seated, thereby closing the transporting outlet 5.

The transporting inlet 4 and the transporting outlet 5 are provided with openings which are longer in the vertical direction. A substrate holder 3 on which substrates are detachably mounted is transported into and out through the openings in a vertically upright posture by fixing the lower end thereof to a long substrate holder support 23, thereby enabling the holder 3 to move together with the substrate holder support 23. A total of four wheels 24 are provided on the sides of the front and rear ends of the substrate holder support 23. A rack bar 22 is provided on the lower side of the substrate holder support 23 by holding it there with a spring (not shown).

Inside of the lock chamber 1, there is provided a transport mechanism 18. This transport mechanism 18 comprises, for example, a pinion gear 21 fixed to a rotatable shaft 20 which is rotated by a rotating mechanism (not shown) and a pair of parallel rails 25, 25. When the pinion gear 21 is rotated in mesh with the rack bar 22, the wheels 24 of the substrate holder support 23 are moved on the rails 25, 25, thereby transporting the substrate holder 3.

A gas inlet port 26 is provided in an upper plate which forms a chamber wall of the lock chamber 1. An exhaust port 27 is provided in a horizontal bottom plate which forms another chamber wall.

Further, as shown in FIG. 13, a gas introduction pipe 30 having a gas introduction shutoff valve 28 and a gas flow regulating valve 29 is connected to the gas inlet port 26 of the lock chamber 1. A gas exhaust pipe 33 having a gas exhaust shutoff valve 31 and a gas exhaust speed regulating valve 32 is connected to the gas exhaust port 27 of the lock chamber 1.

The conventional loading and unloading airlock apparatus is constructed as described above and does not have a means of regulating the flow of gas inside the lock chamber 1. There was a problem in that gas turbulences occur inside the lock chamber 1 when the lock chamber 1 is brought back to atmospheric pressure by introducing a gas into the chamber 1 through the gas introduction pipe 30 or, in the reverse, when the chamber 1 is evacuated through the gas exhaust pipe 33. Such gas turbulence can cause the dust particles which have accumulated inside vacuum chamber 1 to be agitated and adhere to the substrates 2. The adhesion of dust particles is not desirable because the dust particles adhered to the substrates 2 will be a hindrance in forming thin films on the substrates 2 or subjecting the films on the substrates to hyperfine processing, thereby giving rise to inferior products.

In order to prevent the adhesion of dust particles, the lock chamber 1 is conventionally returned to atmospheric pressure by slowly introducing a gas therein or is slowly evacuated so that no gas turbulences occur inside the chamber There was a disadvantage in that, since it took a long time to perform gas introduction or gas exhausting, the treatment efficiency could not be increased. Further, since the bottom plate on which the gas exhaust port 27 is provided is horizontal, it has been found that, when chamber 1 is evacuated, swirls occurred in a space in the neighborhood of the inlet to the gas exhaust port 27, and that the dust particles in the neighborhood of the gas exhaust port 27 are raised by the swirls and can adhere to the substrates 2.

Table 1 given below shows the quantity of dust particles of 0.5 micron and over in diameter which adhered to a 5-inch wafer when a lock chamber 1 of about 1,000 liters in volume was evacuated.

TABLE 1

| Method of exhausting | Timing of exhausting | Quantity of dust particles |
|---|---|---|
| quick exhausting | 40 seconds for vacuum chamber pressure to change from 760 Torr to 0.2 Torr | 1,000–5,000 pcs |
| slow exhausting | 10 minutes for vacuum chamber pressure to change from 760 Torr to 0.2 Torr | 1,000–3,000 pcs |
| slow exhausting | 8 hours for vacuum chamber pressure to change from 760 Torr to 0.2 Torr | 10–100 pcs |

The object of this invention is to solve the conventional problems and disadvantages and to provide a loading and unloading airlock apparatus which enables evacuation of the lock chamber and return thereof back to atmospheric pressure in a shorter time and to decrease the quantity of dust particles adhering to the substrates.

SUMMARY OF THE INVENTION

In order to attain the above objects, this invention comprises a loading and unloading airlock apparatus for a vacuum treatment chamber comprising an airlock chamber, a transport mechanism inside the chamber to transport a substrate holder of plate form arranged to have substrates detachably mounted thereon, an exhaust port to evacuate the chamber to a vacuum, a gas inlet port to introduce a gas to bring the evacuated chamber back to atmospheric pressure, a rectifying plate provided in the chamber adjacent to and at a predetermined spaced distance away from the substrate holder on that side of the substrate holder upon which the substrates are detachably mounted, and a gas introduction pipe means having a gas ejection outlet in said chamber for introducing additional gas in a space defined by the predetermining distance to flow along the surfaces of the substrates and the substrate holder.

In this invention, since a rectifying plate is provided in the airlock chamber at a predetermined distance off of the surface of the substrate holder and since a gas introduction pipe which has a gas ejection outlet which injects a gas towards the space defined by the distance is provided, rectified gas flow can be formed along the surface of the substrate holder, when the chamber is evacuated through a gas exhaust port or when the chamber is brought back to atmospheric pressure by introducing a gas from a gas inlet port, by simultaneously ejecting the gas also out of the gas introduction pipe having a gas ejection outlet, even though there may be gas turbulences inside the chamber. Substrates are mounted on the surface of the substrate holder and, since the gas free from dust particles from the gas introduction pipe having the gas ejection outlet flows along the surface of the substrate and since the rectifying plate is provided a long side the flow, the potential swirling of the dust particles which may be somewhat raised inside the vacuum chamber is interrupted by the rectified flow as well as the rectifying plate and, therefore there will be smaller chances of the particles adhering to the substrates.

Although the volume of the gas to flow through the vacuum chamber increases by the additional amount that is introduced from the gas introducing pipe, the evacuating time can be shortened by employing an exhausting pump of larger capacity which is to be connected to the exhaust port.

BRIEF DESCRIPTION OF THE DRAWINGS

FIG. 1 is a vertical sectional view of the loading and unloading airlock chamber apparatus, FIG. 2 is a sectional view taken along the line II—II in FIG. 1 and FIG. 3 is a sectional view taken along the line III—III in FIG. 1.

FIG. 4 is a left side view of FIG. 1 and FIG. 5 is a schematic diagram.

FIGS. 6 through 9 show a second embodiment of this invention.

FIG. 6 is a vertical sectional view of the loading and unloading airlock apparatus, FIG. 7 is a sectional view taken along the line VII—VII in FIG. 6, FIG. 8 is a sectional view taken along the line VIII—VIII in FIG. 6, and FIG. 9 is a right side view of FIG. 6.

FIG. 10 is a vertical sectional view of the loading and unloading airlock apparatus, FIG. 11 is a sectional view taken along the line XI—XI in FIG. 10, FIG. 12 is a sectional view taken along the line XII—XII in FIG. 10 and FIG. 13 is a schematic diagram.

DETAILED DESCRIPTION OF PREFERRED EMBODIMENTS

Figure 1:
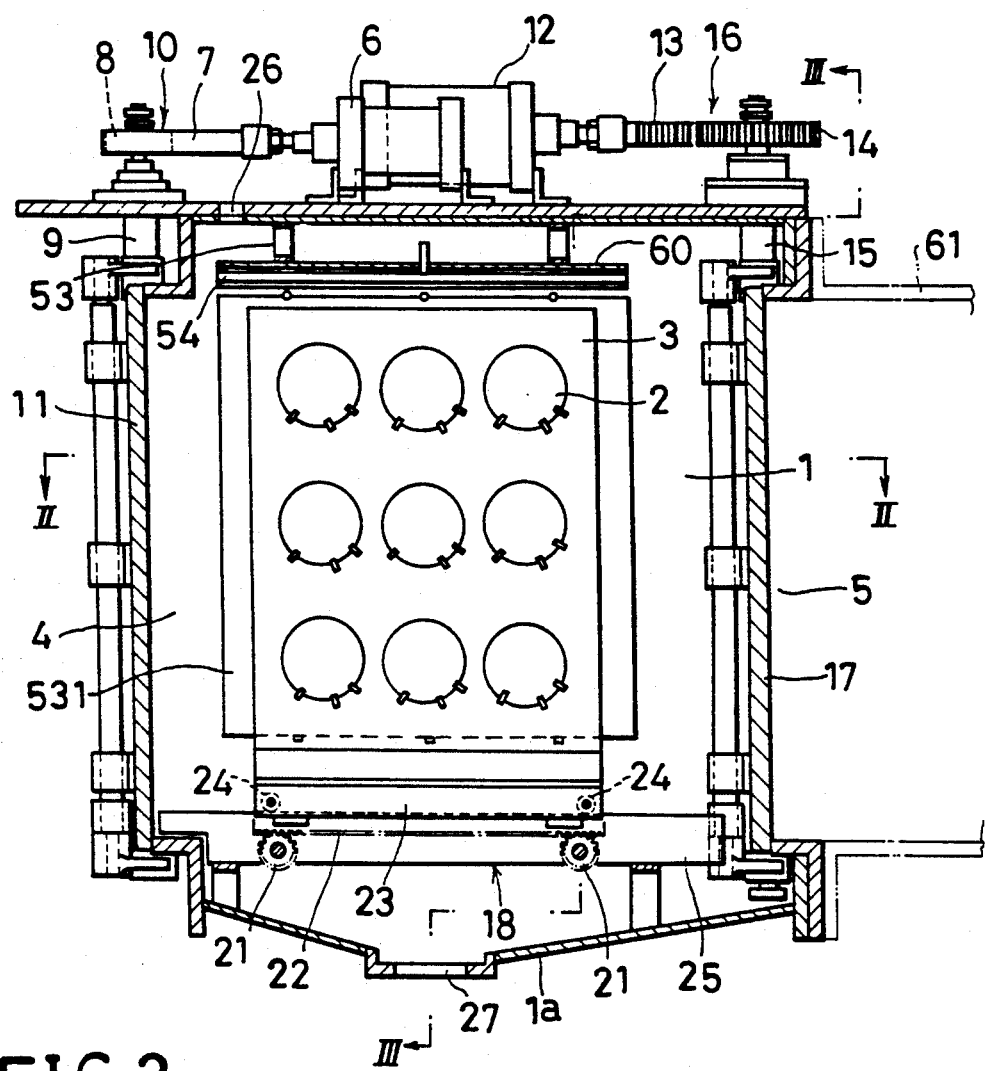
FIGS. 1 through 5 show a first embodiment of a loading and unloading airlock apparatus of this invention.
Figure 2:
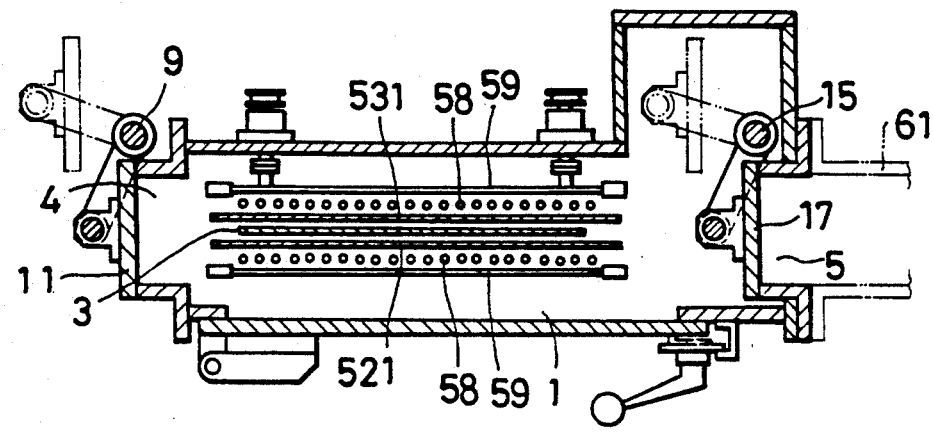
Figure 3:
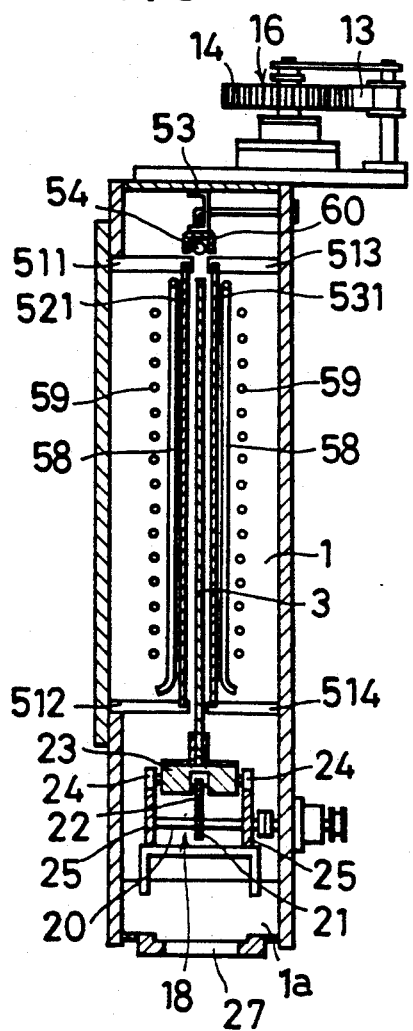
Figure 4:
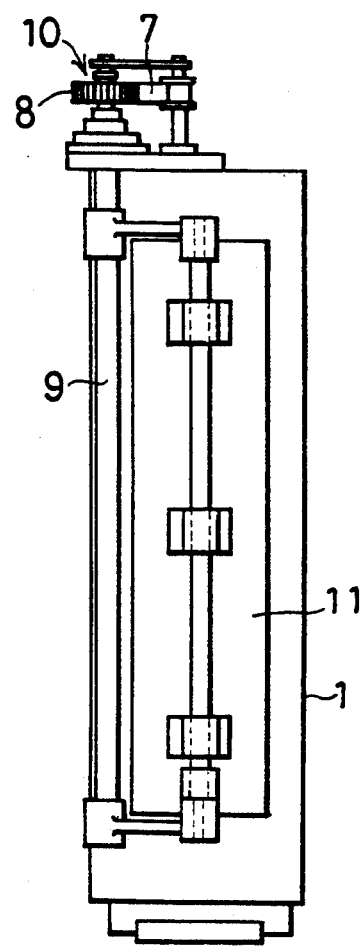

Now, an embodiment of this invention is described with reference to the accompanying drawings.

A first embodiment of a loading and unloading airlock apparatus of this invention is shown in FIGS. 1 through 5. When the loading and unloading airlock apparatus is used as an airlock for loading substrates to a vacuum treatment chamber in order to form thin films on the substrates or subject the thin films formed on the substrates to hyperfine processing in the vacuum treatment chamber, the loading and unloading airlock apparatus is directly connected in hermetically sealed communication with the inlet of the vacuum treatment chamber. When the loading and unloading airlock apparatus is used as an unloading airlock for unloading the substrates treated in the vacuum treatment chamber without impairing the atmosphere, the loading and unloading airlock apparatus is directly connected in hermetically sealed communication with the outlet of the vacuum treatment chamber.

Among the reference numerals given in FIGS. 1 through 5, those having the same numerals as the ones in FIGS. 10 through 13 show the same parts and, therefore, their explanation is omitted.

The differences between the first embodiment shown in FIGS. 1 through 5 and the conventional device shown in FIGS. 10 through 13 are explained hereinbelow. First, in the first embodiment, brackets 511 and 512 are projectingly provided at the upper and the lower portions of one side of a chamber wall of the airlock chamber 1. A rectifying plate 521 made of quartz glass is vertically fixed to those brackets 511 and 512. When the substrate holder 3 is transported into the vacuum chamber 1 in an upright position, the rectifying plate 521 faces the surface of the substrate holder 3 on which substrates 2 are detachably mounted at a predetermined distance. Further, brackets 513 and 514 are provided at the upper and the lower inner portions of the opposite side of the chamber wall of the chamber 1. A rectifying plate 531 made of quartz glass is also vertically fixed to those brackets 513 and 514. The rectifying plate 531 faces the opposite side of the surface of the substrate holder 3 at a predetermined distance. Therefore, the two rectifying plates 521, 531 are parallel to each other and are positioned so that a substrate holder 3 having substrates mounted on both sides thereof can be interposed in between the two plates 521, 531.

A bracket 53 is provided on an upper plate which constitutes a wall of the chamber 1. A gas introduction pipe 54 is attached to this bracket 53. The pipe 54 is introduced from outside the chamber 1 and is positioned such that the gas ejection outlet is set above an upper end of the vertically postured substrate holder 3. The gas introduction pipe 54 having the gas ejection outlet is provided with a plurality of gas ejection openings (not shown) which eject the gas towards the upper end of the vertically postured substrate holder 3, in other words, in the downward direction. Therefore, the gas ejected out of the gas ejection openings of the gas introduction pipe 54 having the gas ejection outlet is caused to flow in the spaces defined by the predetermined distances between the vertically postured substrate holder 3 and the rectifying plates 521, 531 from the upper end towards the lower end of the surfaces of the substrate holder 3 and flows out of the lower portion of each space for exhausting out of the exhaust port 27.

It is advantageous to provide the exhaust port 27 in a position opposite to the gas ejection openings of the gas introduction pipe 54 having the gas ejection outlet across the substrate holder 3. In this embodiment, the exhaust port 27 is provided in an inclined bottom plate 1a which constitutes one of the chamber walls.

Figure 5:
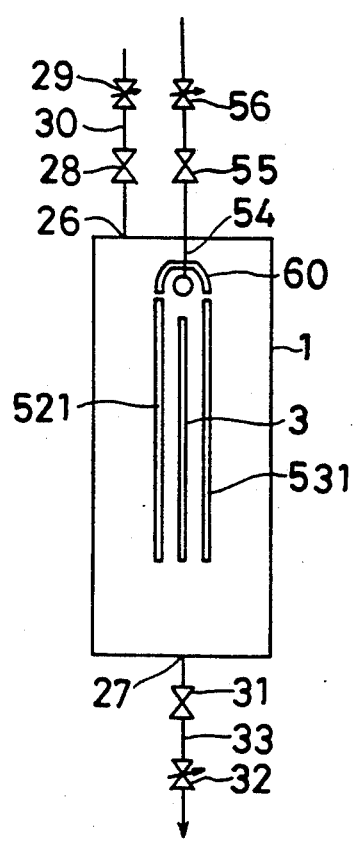
Figure 6:
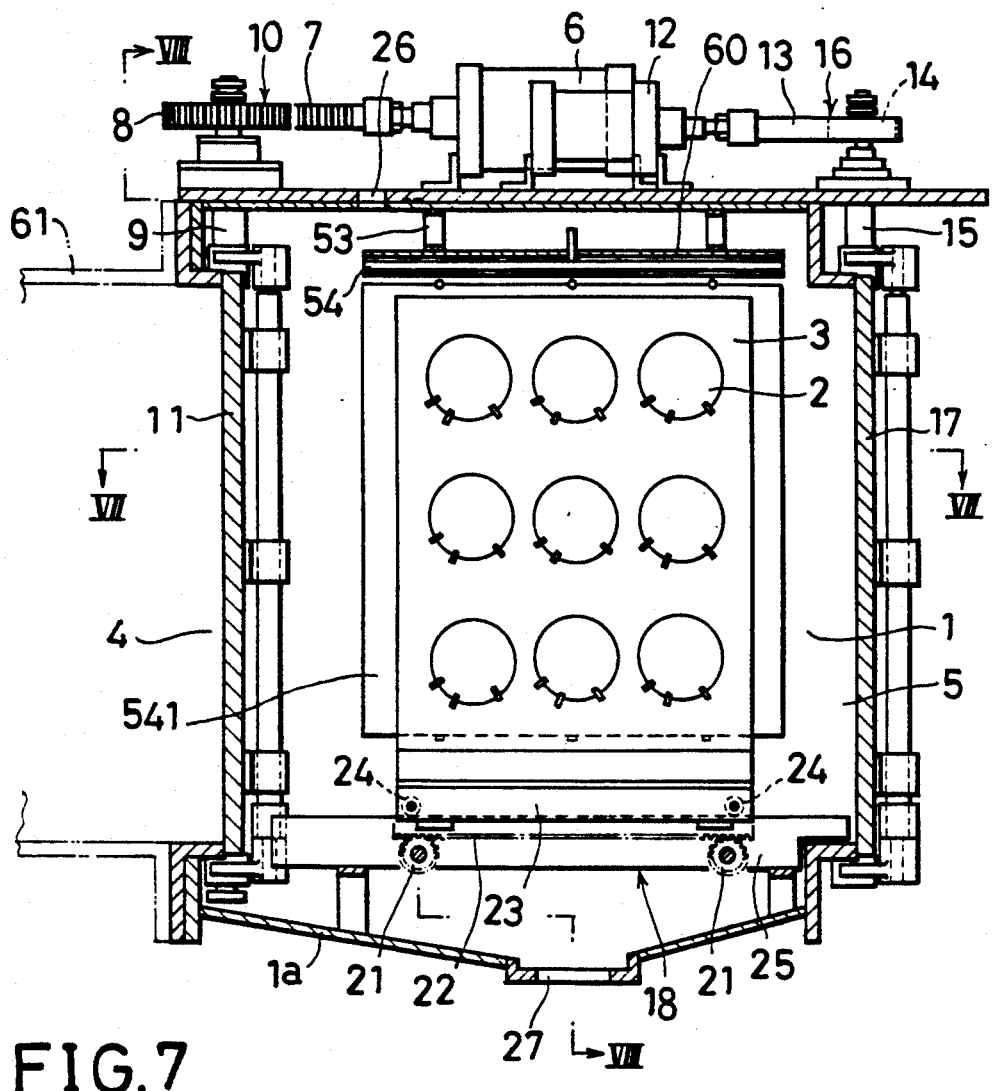
Figure 7:
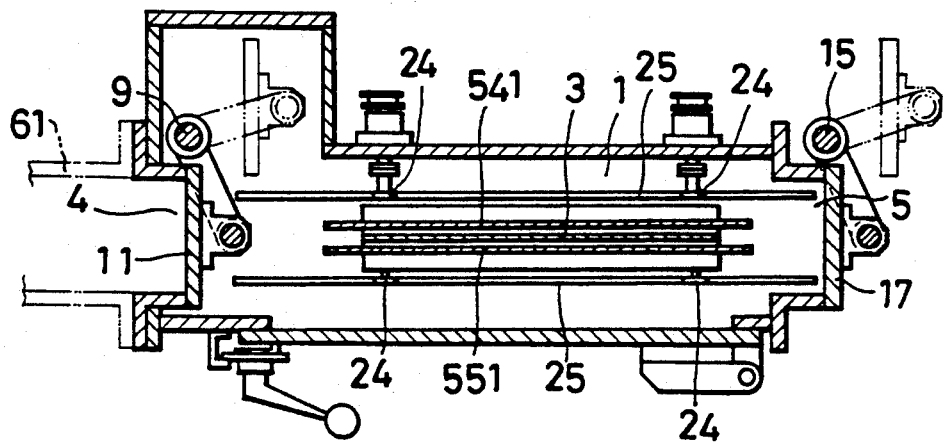
Figure 10:
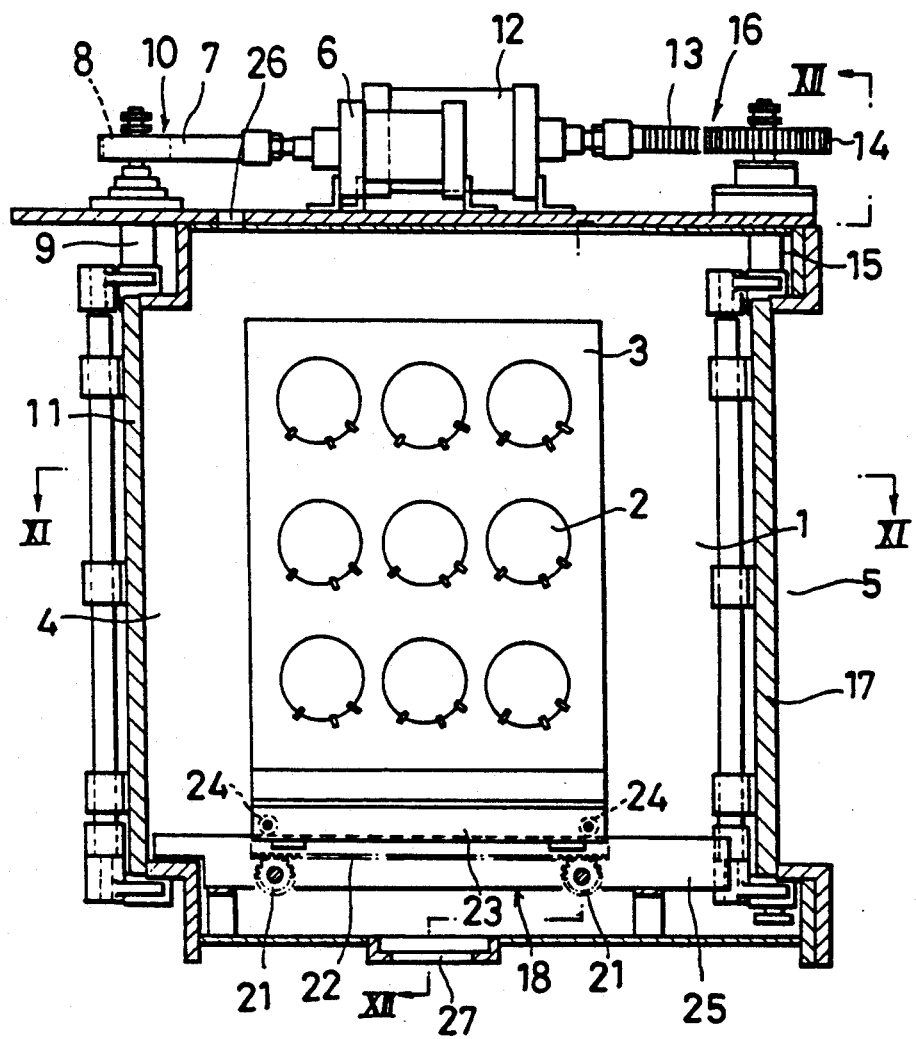
FIGS. 10 through 13 show a conventional loading and unloading airlock apparatus.
Figure 11:
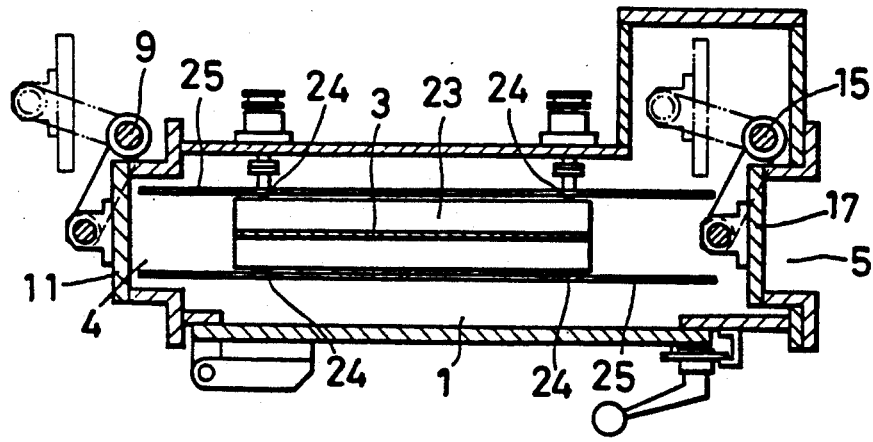
Figure 12:
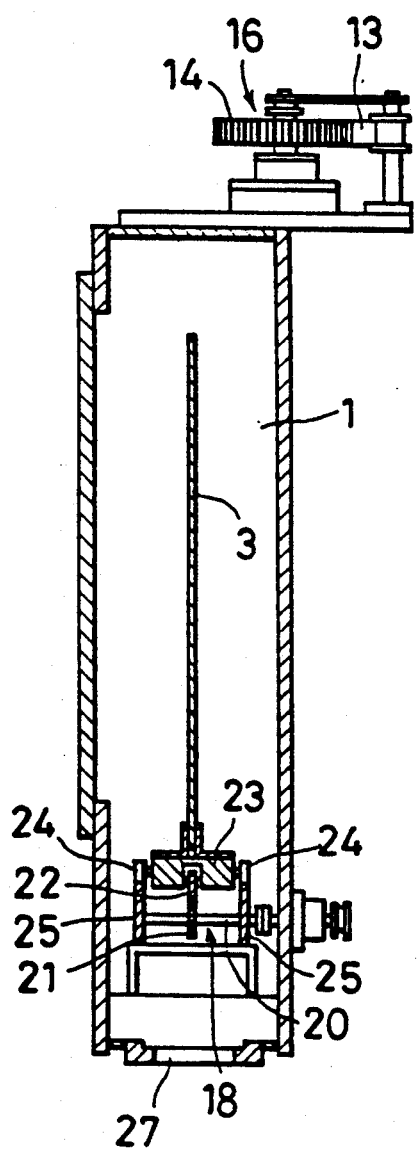
Figure 13:
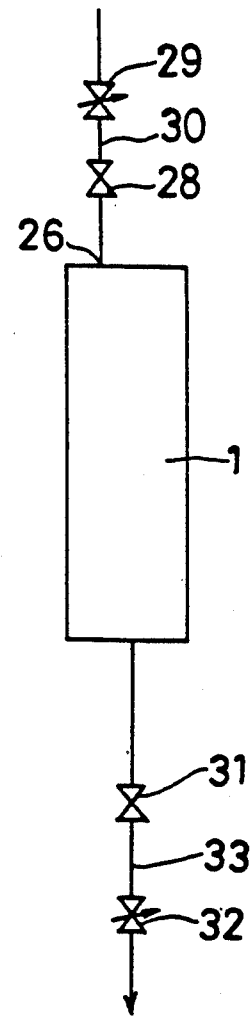

The gas introduction pipe 54 having the gas ejection outlet extends outside the chamber 1 and is provided outside the chamber 1 with a gas introduction shutoff valve 55 and a gas flow regulating valve 56 as shown in FIG. 5. Further, a vacuum pump (not shown) is connected to the gas exhaust pipe 32 and can have an exhausting speed of at least twice that of a conventional one used in a conventional loading and unloading airlock apparatus of an equivalent size.

In the first embodiment described above, the gas ejected out of the gas ejection openings of the gas introduction pipe 54 having the gas ejection outlet is caused to flow in the space between the vertically positioned substrate holder 3 and the rectifying plate 521 and in the space between the vertically positioned substrate holder 3 and the rectifying plate 531, from the upper portion downwards along the surfaces of the substrates 2 and of the substrate holder 3. Therefore, if the gas is ejected out of the gas introduction pipe 54 having the gas ejection outlet while the chamber 1 is being evacuated out of the exhaust port 27, the clean gas from the gas introduction pipe 54 having the gas ejection outlet flows in laminar flow and, at the same time, the dust particles are prevented by the rectifying plates from flowing into the laminar gas stream. As a result, the quantity of particles adhered to the surfaces of the substrates 2 becomes significantly small. Furthermore, since the gas exhaust port 27 is provided at the lowest portion of the inclined bottom plate 1a which forms part of the chamber wall, the gas flows along the inclined bottom plate 1a. Since swirls do not occur in the neighborhood of the inlet to the exhaust port 27, any gas turbulences are substantially avoided. As a consequence, dust particles, if any, which are accumulated on the bottom plate 1a are not raised.

Further, in quickly returning the chamber 1 to atmospheric pressure, the operation is carried out by introducing a gas from the gas inlet port 26 provided at the upper part of the chamber 1. At this time, if the additional rectified gas is caused to flow in the space between the substrates 2 and the rectifying plates 521 and 531 by ejecting the gas from the ejecting openings of the gas introduction pipe 54 having the ejection outlet, the surfaces of the substrates 2 and of the substrate holder 3 are covered by clean gas, thereby decreasing the quantity of dust particles adhered to the surfaces of the substrates 2.

Table 2 shows, like Table 1, the quantity of dust particles of 0.5 micron and over in diameter which adhered to a substrate of 5-inch wafer when an airlock chamber 1 of about 1,000 liter in volume built in accordance with the present invention was evacuated.

TABLE 2

| Time of exhausting | Quantity of dust particles |
| --- | --- |
| 1 minute for vacuum chamber pressure to change from 760 Torr to 0.2 Torr | 0 to 20 pieces |

As is clearly seen by comparison of Table 1 and Table 2, it is noted that, according to the first embodiment of this invention, the adhesion of dust particles to the surfaces of substrates can be prevented even without slow evacuation.

In FIGS. 1 through 5 show the first embodiment, reference numerals 58 and 59 denote lamp heaters to heat the substrates 2 and reference numeral 60 denotes a shade provided around the gas introduction pipe 54. The reference numeral 61 denotes a vacuum treatment chamber to which loading and unloading airlock of the present invention is attached.

Next, FIGS. 6 through 9 show a second embodiment of this invention. The second embodiment differs from the first embodiment in that the rectifying plates 541 and 551 are made of metal instead of quartz and that there are no lamp heaters provided for heating the substrates 2. Otherwise the second embodiment is the same as the first embodiment; therefore further description thereof is omitted.

In the above first and the second embodiments the substrate holders are vertically postured. However, they may be horizontally positioned. In such a case, a pair of parallel rectifying plates are also horizontally positioned, and the gas ejection openings of the gas introduction pipe having the gas ejection outlet are also horizontally positioned. Further, although the gas ejection openings of the gas introduction pipe having the gas ejection outlet are made of a plurality of small holes in the first and the second embodiments, they may be made as slits in shape. Further, in each of the above embodiments, since the substrates 2 are detachably mounted on both sides of the vertically positioned substrate holder 3, one rectifying plate is positioned on each side of the substrate holder 3. However, if the substrates 2 are mounted only on one side of the substrate holder 3, the rectifying plate may be provided only on one side of the substrate holder at a predetermined distance away from the substrate holder 3. The same applies to the case of a horizontally positioned substrate holder 3 with substrates mounted only on one side thereof.

Since a loading and unloading airlock apparatus of this invention is provided with a rectifying plate spaced at a predetermined distance on that side of a substrate holder on which substrates are mounted and is also provided with an additional gas introduction pipe having a gas ejection outlet to eject a gas towards the space defined by the predetermined distance, rectified gas flows can be made to flow along the surface of the substrates and of the substrate holder when the airlock chamber is evacuated or is brought back to atmospheric pressure, if the gas is ejected out of the gas introduction pipe having the gas ejection outlet, even though there may be gas turbulences inside the chamber. As a consequence, even if the chamber is quickly evacuated or brought back to atmospheric pressure, the quantity of dust particles adhered to the surfaces of the substrates can be reduced. At the same time, the efficiency of substrate treatment can be increased and the rate of occurrence of inferior products due to the adhesion of dust particles can be decreased.

It is readily apparent that the above-described has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. A loading and unloading airlock apparatus for a vacuum treatment comprising:

an airlock chamber;

a transport means inside the airlock chamber for transporting into and out of said airlock chamber a substrate holder means for detachably mounting substrates thereon;

an exhaust port means for exhausting the airlock chamber to a vacuum;

a gas inlet port means for introducing a gas into said airlock chamber to bring the airlock chamber, which has been exhausted, back to atmospheric pressure;

at least one rectifying plate means located inside said airlock chamber adjacent to and at a predetermined distance away from the substrate holder means, said rectifying plate means provided on a side of said substrate holder means upon which the substrates are detachably mounted; and a gas introduction pipe means, having a gas ejection outlet in said airlock chamber, for introducing additional gas in a space defined by said predetermined distance to flow along surfaces of said substrates and said substrate holder means.

2. A loading and unloading airlock apparatus defined in claim 1 wherein one rectifying plate means is provided on each side of said substrate holder means.

3. A loading and unloading airlock apparatus as defined in claim 2 wherein said airlock chamber has walls, part of at least one wall of said airlock chamber is inclined and said exhaust port means is provided in said inclined part of said at least one wall.

4. A loading and unloading airlock apparatus as defined in claim 1 wherein said airlock chamber has walls, part of at least one wall of said airlock chamber is inclined and said exhaust port means is provided in said inclined part of said at least one wall.

* * * * *

UNITED STATES PATENT AND TRADEMARK OFFICE
CERTIFICATE OF CORRECTION

PATENT NO. : 5,147,168
DATED : September 15, 1992
INVENTOR(S) : Hidenori SUWA et al It is certified that error appears in the above-identified patent and that said Letters Patent is hereby corrected as shown below:

On the cover page, Item [73], the Assignee's name "Gujutsu" should read as --Gijutsu--.

Signed and Sealed this

Fifteenth Day of March, 1994

Attest:

BRUCE LEHMAN

*Attesting Officer*     *Commissioner of Patents and Trademarks*